(12) United States Patent
Sugimoto et al.

(10) Patent No.: US 6,231,986 B1
(45) Date of Patent: May 15, 2001

(54) INORGANIC COMPOSITION FOR LOW TEMPERATURE FIRING

(75) Inventors: Yasutaka Sugimoto, Kyoto; Kazuo Kishida; Hirofumi Sunahara, both of Shiga-ken; Hiroshi Takagi, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 08/899,281

(22) Filed: Jul. 23, 1997

(30) Foreign Application Priority Data

Jul. 24, 1996 (JP) .................................................. 8-194908

(51) Int. Cl.[7] ............................... B32B 17/06; C03C 1/00
(52) U.S. Cl. ........................ 428/426; 174/256; 428/428; 501/32; 501/66; 501/77; 501/128
(58) Field of Search .................................. 501/32, 66, 77, 501/128; 174/256; 428/209, 210, 426, 428

(56) References Cited

U.S. PATENT DOCUMENTS

| 4,777,092 | * | 10/1988 | Kawakami | ........................... 428/428 |
| 5,283,210 | | 2/1994 | Kata et al. . | |

FOREIGN PATENT DOCUMENTS

0478971 A2   9/1990   (EP) .
0423752 A2   4/1991   (EP) .

OTHER PUBLICATIONS

Patent Abstracts of Japan; vol. 012, No. 186 (C–500), May 31, 1988 (Ashi Glass Co., Ltd.; Dec. 19, 1997.

"Low–Temperature, Low–Dielectric, Crystallizable Glass Composite"; Jau–Ho Jean, et al.; *IEEE Transactions on Components, Packaging, and Manufacturing Technology,* Part B; vol. 18, No. 4; Nov. 1995; pp. 751–754.

"Sintering of Cordierite Glass–Ceramic with Lead Borosilicate Glass"; Shen–Li Fu, et al.; Ceramics International; 20; No. 1; 1994; pp. 67–72.

"Preparation and Properties of Low-k Crystallizable Glass Composite"; Jau–Ho Jean, et al.; *International Journal of Microcircuits & Electronic Packaging;* vol. 18; No. 2; Second Quarter 1995; pp. 179–184.

"Low Temperature Sintering of $P_2O_5$–Added Cordierite Glass with Borosilicate Glass"; Shen–Li Fu, et al.; *Jpn. J. Appl. Phy.;* vol. 32; Part 2; No. 3A; Mar. 1, 1993; pp. L326–L328.

* cited by examiner

Primary Examiner—Deborah Jones
Assistant Examiner—Robert R. Koehler
(74) *Attorney, Agent, or Firm*—Ostrolenk, Faber, Gerb & Soffen, LLP

(57) ABSTRACT

An inorganic composition for low temperature firing comprising about 15 to 40 weight % of glass powder and about 60 to 85 weight % of cordierite, is disclosed. The glass powder is composed of about 20 to 60 weight % of $SiO_2$, about 30 to 50 weight % of $B_2O_3$, about 5 to 30 weight % of MgO, 0 to about 15 weight % of $Al_2O_3$, and about 1 to 5 weight % of $R_2O$ (R is alkali metal). The inorganic composition is capable of being fired at a relative low temperature, and has a low thermal expansion coefficient and permittivity, as well as high mechanical strength.

12 Claims, No Drawings

INORGANIC COMPOSITION FOR LOW TEMPERATURE FIRING

BACKGROUND OF THE INVENTION

1. Field of the Invention

The present indention relates generally to an inorganic composition for low temperature firing, more particularly, to an inorganic composition for use in a multilayered ceramic printed circuit board.

2. Description of the Prior Art

With miniaturizing of the electronic devices, ceramic printed circuit boards have been widely used for various electronic devices. Nowadays, multilayered ceramics have been developed to achieve high integration, and are prepared by forming a circuit pattern on a surface of the ceramic green sheet, laminating several sheets and firing. Alumina has been used as a material of such a multilayered ceramic printed circuit board.

However, alumina has several drawbacks. Since the firing temperature for alumina is as high as 1500 to 1600° C., a large amount of energy is required, thereby inherently causing a high cost. Since the electroconductive material having a high specific resistance for an inner circuit formed in the multilayered printed circuit board is limited to tungsten (W), molybdenum (Mo), or the like, which are not oxides under high firing temperature, the electric resistance of the circuit per se inherently becomes higher. Since the thermal expansion coefficient of alumina is higher than those of a silicon chip which is mounted on the alumina board, thermal stress is imparted to the silicon chip, thereby causing cracks. Since alumina has a dielectric constant as high as about 10, the delay in signal transmission in the circuit becomes longer.

Under the circumstances, the inventors have been studied and developed a ceramic composition for low-temperature firing of multilayered ceramic printed circuit board.

Laid-open Japanese patent application No. 1-246176 discloses a ceramic composition. The method of producing a multilayered ceramic printed circuit board in accordance with the application is as follows: Firstly, cordierite powder, powder of oxides/or compounds of Ca, Sr, or Ba, $SiO_2$ powder, MgO and $Al_2O_3$, and oxides/or compounds of Cr, Fe, Co, Ni or Cu, are weighed and mixed. Then, the mixed material is calcined and crushed into powder. A ceramic slurry is made by adding binder to the powder. Next, a ceramic green sheet is prepared by means of a sheet forming method, for example, the doctor blade method. A plurality of the ceramic green sheets are laminated and sintered to obtain a multilayered ceramic printed circuit board.

SUMMARY OF THE INVENTION

An object of the present invention is to provide an inorganic composition which is capable of being sintered at relatively low temperature, and has a lower thermal expansion coefficient and higher mechanical strength.

The present invention is characterized in that the inorganic composition comprises about 15 to 40 weight % of glass powder and about 60 to 85 weight % of cordierite.

The glass powder comprises about 20 to 60 weight % of $SiO_2$, about 30 to 50 weight % of $B_2O_3$, about 5 to 30 weight % of MgO, 0 to about 15 weight % of $Al_2O_3$, and about 1 to 5 weight % of $R_2O$ (where R represents alkali metal).

The inorganic composition forms a dense fired body, even when fired under a low temperature of 1000° C. or lower, and has a low thermal expansion rate and induction rate, and high mechanical strength, as well.

Still further, since the support is fired at a temperature of 1000° C. or less, metals having a low melting points, such as Ag/Pd and Cu, may be used as the electroconductive material for circuit patterns, thereby allowing reduction of the electroconductive resistance of the circuit.

The present invention provides a printed circuit board using the inorganic composition for low temperature firing.

DETAILED DESCRIPTION OF THE INVENTION

An embodiment of the present invention is further explained with referring to the examples, which are not construed as limiting scope of the present invention.

EXAMPLE

An inorganic composition for low temperature firing was prepared with glass powder and cordierite powder as follows:

At first, $SiO_2$, $B_2O_3$, $MgCO_3$, $Al_2O_3$ and $Li_2CO_3$ were used as a raw material to form the glass powder.

Each component was weighed so as to obtain glass having the components shown on Table 1 below. In Table 1, the "glass composition" shows the proportion (in weight %) of each component respect to the weight % of the glass as 100, that is after deducting the weight of the cordierite component from the total weight of the inorganic composition. In Table 1, a sample number with asterisk mark (*) is outside of the present invention.

TABLE 1

| Sample No. | Glass powder (wt %) | Glass composition (wt %) | | | | | Cordierite powder (wt %) |
|---|---|---|---|---|---|---|---|
| | | $SiO_2$ | $B_2O_3$ | MgO | $Al_2O_3$ | $Li_2O$ | |
| *1 | 45 | 27 | 40 | 22 | 8 | 3 | 55 |
| 2 | 40 | 27 | 40 | 22 | 8 | 3 | 60 |
| 3 | 15 | 27 | 40 | 22 | 8 | 3 | 85 |
| *4 | 10 | 27 | 40 | 22 | 8 | 3 | 90 |
| *5 | 20 | 15 | 48 | 26 | 8 | 3 | 80 |
| 6 | 20 | 27 | 40 | 22 | 8 | 3 | 80 |
| *7 | 20 | 65 | 16 | 8 | 8 | 3 | 80 |
| *8 | 20 | 18 | 55 | 16 | 8 | 3 | 80 |
| *9 | 20 | 39 | 50 | 0 | 8 | 3 | 80 |
| *10 | 20 | 22 | 32 | 35 | 8 | 3 | 80 |
| 11 | 20 | 41 | 35 | 13 | 8 | 3 | 80 |
| *12 | 20 | 24 | 34 | 19 | 20 | 3 | 80 |
| *13 | 20 | 28 | 41 | 23 | 8 | 0 | 80 |
| *14 | 20 | 26 | 39 | 21 | 8 | 6 | 80 |
| 15 | 20 | 20 | 49 | 20 | 8 | 3 | 80 |
| 16 | 20 | 60 | 31 | 6 | 1 | 2 | 80 |
| 17 | 20 | 55 | 30 | 6 | 6 | 3 | 80 |
| 18 | 20 | 21 | 50 | 15 | 8 | 3 | 80 |
| 19 | 20 | 38 | 46 | 5 | 8 | 3 | 80 |
| 20 | 20 | 26 | 33 | 30 | 8 | 3 | 80 |
| 21 | 20 | 33 | 40 | 24 | 0 | 3 | 80 |
| 22 | 20 | 28 | 34 | 20 | 15 | 3 | 80 |
| 23 | 20 | 28 | 40 | 23 | 8 | 1 | 80 |
| 24 | 20 | 27 | 39 | 21 | 8 | 5 | 80 |

Thereafter, the glass composition was heat melted at 1450 to 1550° C. for 1 to 4 hours, and cooled rapidly to form glassy material. The glass chips obtained were pulverized in a zirconia ball mill to obtain a glass powder having 0.5 to 3 μm average diameter.

Separately, the cordierite was pulverized to prepare as a fine powder having 1 to 3 μm average diameter.

Next, said cordierite powder was mixed with each glass powder previously prepared, in an amount of 55 to 90 weight % of the total, as shown on Table 1, and blended in the wet state in a zirconia ball mill for 3 to 4 hours to obtain a homogeneous powder mixture of glass powder and cordierite powder.

Then, an organic binder and solvent, toluene, were added to these mixed powders and fully blended in a ball mill so as to be uniformly dispersed, and treated for defoaming under vacuum to prepare a slurry. In this connection, an organic vehicle, such as binder, solvent, plasticizer, and the like, were used in the same manner as used in a convention process.

With said slurry, a ceramic green sheet of 2 mm in thickness was formed on a film according to a casting method using a doctor blade. After drying, the green sheet was peeled off from the casting substrate and was punched to form a ceramic green sheet having a desired size.

Subsequently, a plurality of said ceramic green sheets were laminated to form a ceramic shaped body by press molding.

Then, these ceramic shaped bodies were heated at a rate of 200° C./hr., and fired at 980° C. for 2 hours, to obtain a ceramic sintered body.

These ceramic sintered bodies were evaluated for thermal expansion coefficient, permittivity and dielectric loss. The results of the evaluation and firing conditions applied are shown in Table 2. In the Table 2, sample numbers having asterisks are outside of the invention.

TABLE 2

| Sample No. | Firing Temp. (° C.) | Firing time (Hr.) | Thermal expansion coefficient (ppm/° C.) | Permittivity (1 MHz) | Dielectric loss (%) | Sintered property |
|---|---|---|---|---|---|---|
| *1 | 980 | 2 | — | — | — | Melt |
| 2 | 980 | 2 | 3.5 | 4.9 | 0.1 | Good |
| 3 | 980 | 2 | 3.0 | 5.1 | 0.1 | Good |
| *4 | 980 | 2 | — | — | — | Not sintered |
| *5 | 980 | 2 | — | — | — | Foamed |
| 6 | 980 | 2 | 3.2 | 5.2 | 0.1 | Good |
| *7 | 980 | 2 | — | — | — | Not sintered |
| *8 | 980 | 2 | — | — | — | Foamed |
| *9 | 980 | 2 | — | — | — | Not sintered |
| *10 | 980 | 2 | — | — | — | Foamed |
| 11 | 980 | 2 | 29 | 5.0 | 0.1 | Good |
| *12 | 980 | 2 | — | — | — | Not sintered |
| *13 | 980 | 2 | — | — | — | Not sintered |
| *14 | 980 | 2 | — | — | — | Foamed |
| 15 | 980 | 2 | 3.6 | 5.3 | 0.1 | Good |
| 16 | 980 | 2 | 3.0 | 4.9 | 0.1 | Good |
| 17 | 980 | 2 | 3.1 | 4.9 | 0.1 | Good |
| 18 | 980 | 2 | 3.6 | 5.2 | 0.1 | Good |
| 19 | 980 | 2 | 3.0 | 5.1 | 0.1 | Good |
| 20 | 980 | 2 | 3.1 | 5.2 | 0.1 | Good |
| 21 | 980 | 2 | 27 | 5.2 | 0.1 | Good |
| 22 | 980 | 2 | 3.8 | 5.3 | 0.1 | Good |
| 23 | 980 | 2 | 3.1 | 5.1 | 0.1 | Good |
| 24 | 980 | 2 | 3.3 | 5.3 | 0.1 | Good |

As seen from the results in the Table 2, the inorganic composition according to the present invention permits one to obtain a ceramic printed circuit board having excellent properties, even if it was fired at a relatively low temperature of 1000° C. or lower, showing a good firing property, low permittivity of as small as 4.9 to 5.3, comparing with alumina, and having a small thermal expansion coefficient of 2.7 to 3.8 ppm/° C., as well as a small dielectric loss.

The reason for restricting compositions of the low firing inorganic composition are explained below.

Regarding as compositions of the glass and cordierite: as shown in the results of Sample No. 1, when the composition contains the cordierite in a amount of less than about 60 weight i, the firing temperature becomes too low and the composition is melted in firing step, and since the amount of the glass becomes inherently large, the strength of the final product becomes weak. On the other hand, as shown in the results of Sample No. 4, when the amount of the cordierite is over about 85 weight %, the composition cannot be fully sintered. Accordingly, the cordierite powder is preferably used in an amount of about 60 to 85 weight A, and more preferably about 65–80%. Similarly, the corresponding weight of the glass powder is preferably about 15 to 40 weight % and more preferably 20–35%.

Regarding the composition of the glass powder: as shown in the results of Sample Nos. 5 and 8, when the glass powder is composed of $SiO_2$ in an amount of less than about 20 weight %, the viscosity of the melted glass becomes too low, resulting in foaming between ceramic particles. Whereas, as shown in the results of the Sample No. 7, when the amount of the $SiO_2$ is over about 60 weight %, the viscosity of the melted glass becomes higher, resulting in deteriorating the sintering property. Thus, an amount of the $SiO_2$ is preferably about 20 to 60 weight A, and more preferably about 21–55%.

As seen in the results of the Sample No. 7, when the amount of $B_2O_3$ is less than about 30 weight %, the viscosity rises, thereby lowering the sintering property. Also, as shown in the results of the Sample No. 8, when the amount of the $B_2O_3$ is over about 50 weight %, the chemical stability of the glass is deteriorated, thereby causing foaming. Thus, an amount of the $B_2O_3$ is preferably about 30 to 50 weight % and more preferably about 31–46%.

As seen in the results of the Sample No. 9, when the amount of the MgO is less than about 5 weight %, the viscosity of the melted glass is too high, thereby not allowing the composition to sinter, whereas as seen in the result of the Sample No. 10, when the amount of the MgO is over about 30 weight %, the glass reacts with cordierite to cause foaming. Thus, the amount of the MgO is preferably about 5 to 30 weight %, and more preferably about 6–24%.

$Al_2O_3$ is added for improving the chemical stability of the glass. However, as shown in the results of the Sample No. 12, when the amount of the $Al_1O_3$ is over about 15 weight %, the viscosity of the glass becomes too high, thereby preventing sintering the composition. Thus, the amount of the $Al_2O_3$ is preferably 0 to about 15 weight %, and more preferably about 1–10%.

Regarding $R_2O$ (wherein R is alkali metal): as shown in the results of the Sample No. 13, without $Li_2O$, the composition never sintered, while, as seen in the results of the Sample No. 14, when the amount of the $Li_2O$ is over about 5 weight %, the composition foamed. Thus, an amount of the $R_2O$ is preferably about 1 to 5 weight %, and more preferably about 2–4%.

In the Examples above, an oxide was used as the raw powder of the glass, but carbonates, hydroxides, and the like may also be used.

In the Examples above, Li was used to exemplify the alkali metal, but alkali metals other than Li, which include any of Na, K, Rb, Cs, and Fr, may also be used to obtain a similar result.

What is claimed is:

1. An inorganic composition for low temperature firing comprising
    about 15 to 40 weight % of glass powder and about 60 to 85 weight % of cordierite powder,
wherein said glass powder comprises:
about 20 to 60 weight % of $SiO_2$;
about 30 to 50 weight % of $B_2O_3$;
about 5 to 30 weight % of MgO;
0 to about 15 weight % of $Al_2O_3$; and
about 1 to 5 weight % of $R_2O$, where R represents alkali metal.

2. The inorganic composition according to claim 1, wherein said glass powder is about 20–35% and said cordierite is about 65–80%.

3. The inorganic composition according to claim 2, wherein said glass powder comprises:
about 21 to 55 weight % of $SiO_2$;
about 31 to 46 weight % of $B_2O_3$;
about 6 to 24 weight % of MgO;
about 1 to 10 weight % of $Al_2O_3$; and
about 2 to 4 weight % of $R_2O$.

4. The inorganic composition according to claim 1, wherein said glass powder is about 20–35% and said cordierite is about 65–80%.

5. The inorganic composition according to claim 4, wherein said glass powder comprises:
about 21 to 55 weight % of $SiO_2$;
about 31 to 46 weight % of $B_2O_3$;
about 6 to 24 weight % of MgO;
about 1 to 10 weight % of $Al_2O_3$; and
about 2 to 4 weight % of $R_2O$, where R represents alkali metal.

6. The inorganic composition according to claim 1, wherein said glass powder comprises:
about 21 to 55 weight % of $SiO_2$;
about 31 to 46 weight % of $B_2O_3$;
about 6 to 24 weight % of MgO;
about 1 to 10 weight % of $Al_2O_3$; and
about 2 to 4 weight % of $R_2O$, where R represents alkali metal.

7. A ceramic printed circuit board comprising a layer of fired inorganic composition comprising about 15 to 40 weight % of a glass powder, and about 60 to 85 weight % of cordierite,
wherein said glass powder comprises:
about 20 to 60 weight % of $SiO_2$;
about 30 to 50 weight % of $B_2O_3$;
about 5 to 30 weight % of MgO;
0 to about 15 weight % of $Al_2O_3$; and
about 1 to 5 weight % of $R_2O$, where R represents alkali metal.

8. The ceramic printed circuit board according to claim 7, wherein said glass powder is about 20–35% and said cordierite is about 65–80%.

9. The ceramic printed circuit board according to claim 8, wherein said glass powder comprises:
about 21 to 55 weight % of $SiO_2$;
about 31 to 46 weight % of $B_2O_3$;
about 6 to 24 weight % of MgO;
about 1 to 10 weight % of $Al_2O_3$; and
about 2 to 4 weight % of $R_2O$.

10. The ceramic printed circuit board according to claim 7, wherein said glass powder is about 20–35% and said cordierite is about 65–80%.

11. The ceramic printed circuit board according to claim 10, wherein said glass powder comprises:
about 21 to 55 weight % of $SiO_2$;
about 31 to 46 weight % of $B_2O_3$;
about 6 to 24 weight % of MgO;
about 1 to 10 weight % of $Al_2O_3$; and
about 2 to 4 weight % of $R_2O$, where R represents alkali metal.

12. The ceramic printed circuit board according to claim 7, wherein said glass powder comprises:
about 21 to 55 weight % of $SiO_2$;
about 31 to 46 weight % of $B_2O_3$;
about 6 to 24 weight % of MgO;
about 1 to 10 weight % of $Al_2O_3$; and
about 2 to 4 weight % of $R_2O$, where R represents alkali metal.

* * * * *